(12) United States Patent
Lai

(10) Patent No.: US 6,512,241 B1
(45) Date of Patent: Jan. 28, 2003

(54) PHASE CHANGE MATERIAL MEMORY DEVICE

(75) Inventor: Stefan K. Lai, Woodwide, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/039,021

(22) Filed: Dec. 31, 2001

(51) Int. Cl.[7] ................................................ H01L 29/06
(52) U.S. Cl. ................................................ 257/4; 257/3
(58) Field of Search .......................................... 257/3, 4

(56) References Cited

U.S. PATENT DOCUMENTS

| | | | | |
|---|---|---|---|---|
| 3,918,032 A | * | 11/1975 | Nicolaides | ...................... 257/3 |
| 6,031,287 A | * | 2/2000 | Harshfield | ................... 257/734 |
| 6,111,264 A | * | 8/2000 | Wolstenholme et al. | ....... 257/3 |
| 2002/0017701 A1 | * | 2/2002 | Klersy et al. | ............... 257/536 |

* cited by examiner

Primary Examiner—Allan R. Wilson
(74) Attorney, Agent, or Firm—Trop, Pruner & Hu, P.C.

(57) ABSTRACT

A phase change memory with a very limited area of contact between the lower electrode and the phase change material may be formed by defining a closed geometric structure for the lower electrode. The lower electrode may then be covered. The covering may then be opened in a very narrow strip extending across the closed geometric shape using phase shift masking. A phase change material may be formed in the opening. Because the opening effectively bisects the closed geometric structure of the lower electrode, two very small contact areas may be created for contacting the lower electrode to the phase change material.

22 Claims, 3 Drawing Sheets

PHASE CHANGE MATERIAL MEMORY DEVICE

BACKGROUND

This invention relates generally to electronic memories and particularly to electronic memories that use phase change material.

Phase change materials may exhibit at least two different states. The states may be called the amorphous and crystalline states. Transitions between these states may be selectively initiated. The states may be distinguished because the amorphous state generally exhibits higher resistivity than the crystalline state. The amorphous state involves a more disordered atomic structure. Generally any phase change material may be utilized. In some embodiments, however, thin-film chalcogenide alloy materials may be particularly suitable.

The phase change may be induced reversibly. Therefore, the memory may change from the amorphous to the crystalline state and may revert back to the amorphous state thereafter, or vice versa, in response to temperature changes. In effect, each memory cell may be thought of as a programmable resistor, which reversibly changes between higher and lower resistance states. The phase change may be induced by resistive heating.

In some embodiments, the cell may have a large number of states. That is, because each state may be distinguished by its resistance, a number of resistance determined states may be possible, allowing the storage of multiple bits of data in a single cell.

A variety of phase change alloys are known. Generally, chalcogenide alloys contain one or more elements from Column VI of the periodic table. One particularly suitable group of alloys is the GeSbTe alloys.

A phase change material may be formed within a passage or pore through an insulator. The phase change material may be coupled to upper and lower electrodes on either end of the pore.

Ideally, the area of contact between the lower electrode and phase change material should be made as small as possible. This is because the resistance is a function of the contact area. Generally, the smaller the contact area, the higher the resistance. Higher resistance means more effective heating for this same electrical current. Ideally, the minimum amount of electrical current is supplied to each device to make the memory as power conserving as possible.

Thus, there is a need for better ways to reduce the effective size of the lower electrode in phase change memories.

DETAILED DESCRIPTION

Figure 1:
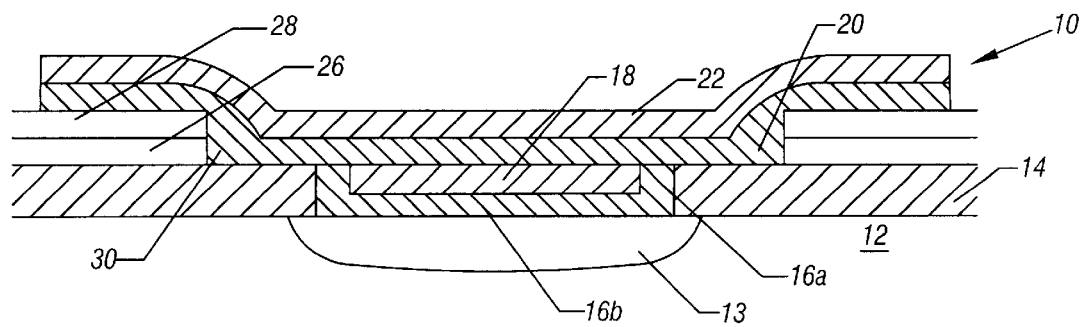
FIG. 1 is a greatly enlarged cross-sectional view in accordance with one embodiment of the present invention.

Referring to FIG. 1, a phase change memory cell 10 may be formed on the substrate 12 that, in one embodiment, may be a silicon substrate. A buried conductive layer 13 may be formed in a substrate 12. In one embodiment, the buried conductive layer 13 may act as a row or column of a memory array.

Positioned over the substrate 12 and aligned with the buried conductive layer 13 is a can-shaped lower electrode 16. The lower electrode 16 includes upwardly directed sides 16a and a lower horizontal portion 16b that actually electrically contacts the line 13.

The interior of the lower electrode 16 may be filled with an insulator 18 such as high density plasma (HDP) oxide, in accordance with one embodiment of the present invention. The lower electrode 16 may be defined within a layer 14 of an insulating material.

A phase change material 20 may contact the upper edges of the sides 16a of the lower electrode 16. An upper electrode 22 may be defined over the phase change material 20. A portion of the upper electrode 22 and the phase change material 20 may rest over a glue layer including a conductive material 28 and an insulator 26. The conductive material 28 may be polysilicon and the insulator 26 may be an oxide in one embodiment of the present invention.

Figure 2:
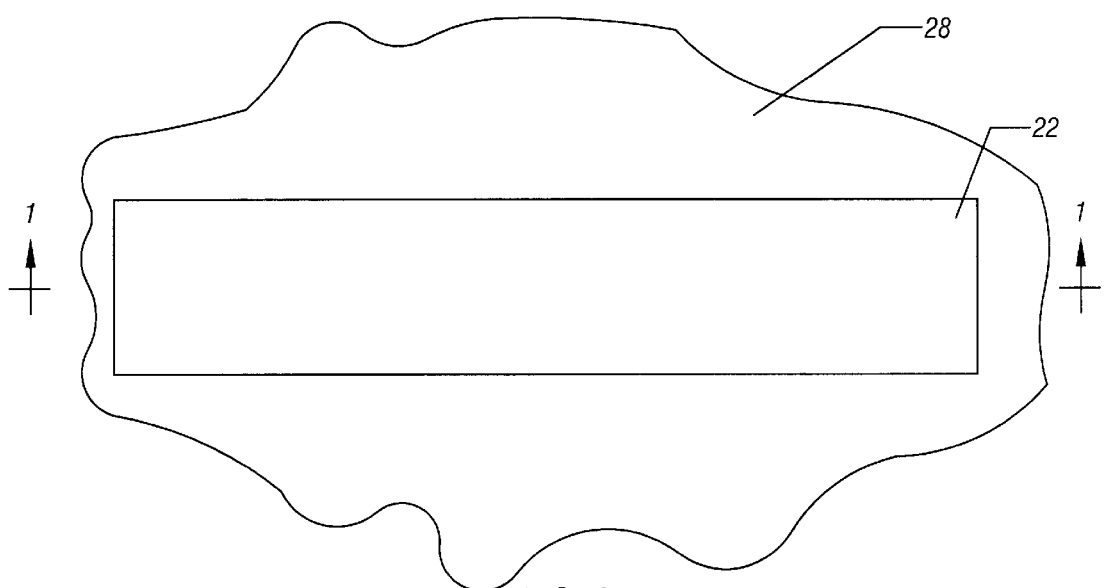
FIG. 2 is an enlarged, top plan view of the embodiment shown in FIG. 1.

Thus, referring to FIG. 2, the upper electrode 22 may be defined over a region covered by the conductive layer 28 that may act as part of a glue layer to adhere the phase change material 20. The lower electrode 22 and the phase change material 20 extend from an upper plateau defined by the glue layer, downwardly through an opening 30 in the glue layer to make direct electrical contact with the lower electrode 16. In this case, the lower electrode 16 may be can-shaped, defining a closed geometrical edge, only a small portion of which makes electrical contact with the phase change material 20.

Figure 3:
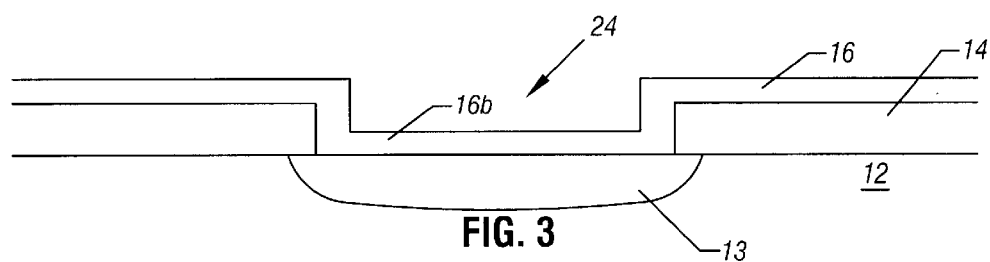
FIG. 3 is an enlarged cross-sectional view of the initial processing of the structure shown in FIG. 1 in accordance with one embodiment of the present invention.

Thus, referring to FIG. 3, the substrate 12 may have a conductive line 13 defined therein, for example, by appropriately doping the substrate 12 using one or more layers to form appropriate p-n junction(s). The substrate 12 may be covered by an insulator layer 14 and an opening may be defined in the insulator layer 14. The entire substrate 12 may then be covered with a conductive material to form the lower electrode 16, such as a metal, using a conventional metal spacer forming step in one embodiment of the present invention. As a result, a slot 24 may be formed in the overall structure.

In one embodiment, the opening defined in the insulator 14 to form the slot 24 may be circular so that the lower electrode 16 takes on an open can shape. However, in other embodiments, the opening to form the lower electrode 16 may be any closed geometric shape including circles, ovals, triangles, trapezoids, squares, or rectangles, to mention a few examples. Electrical contact may be established between the horizontal portion 16b of the electrode 16 and the buried conductive line 13.

Figure 4:
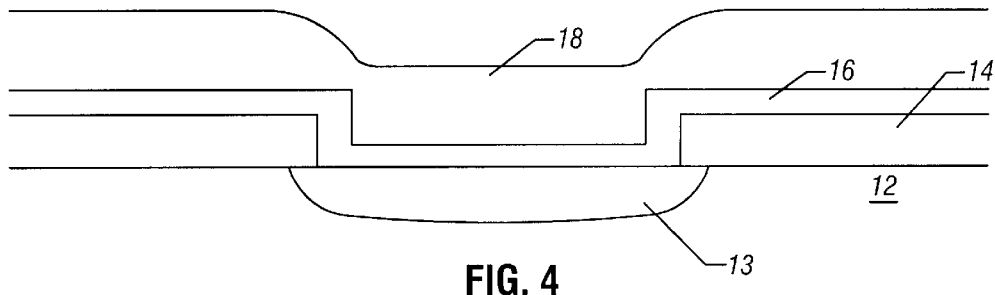
FIG. 4 is an enlarged cross-sectional view of the structure shown in FIG. 3 after further processing.

Referring next to FIG. 4, the slot 24 may be filled with a suitable insulator 18 such as high density plasma (HDP)

oxide, in accordance with one embodiment of the present invention. Thus, in an embodiment in which a circular opening is formed in the insulator layer 14, a conformal layer of insulator 18 may be formed so as to fill the interior of the can-shaped structure of one embodiment of lower electrode 16.

Figure 5:
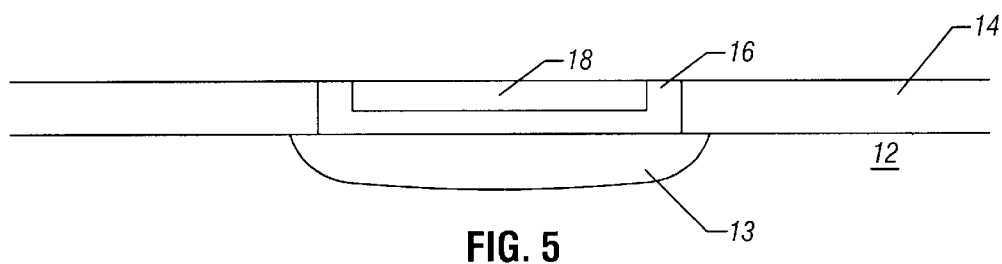
FIG. 5 is an enlarged cross-sectional view of the structure shown in FIG. 4 after further processing.

Next, as shown in FIG. 5, the structure may be planarized, for example, by chemical mechanical planarization (CMP). Planarization removes the uppermost portion of the electrode 16 and insulator 18, defining an open can-shape for the electrode 16. The electrode 16 is filled with the insulator 18 and has an upper edge coincident with the upper surface of the insulator layer 14 in one embodiment.

Figure 6:
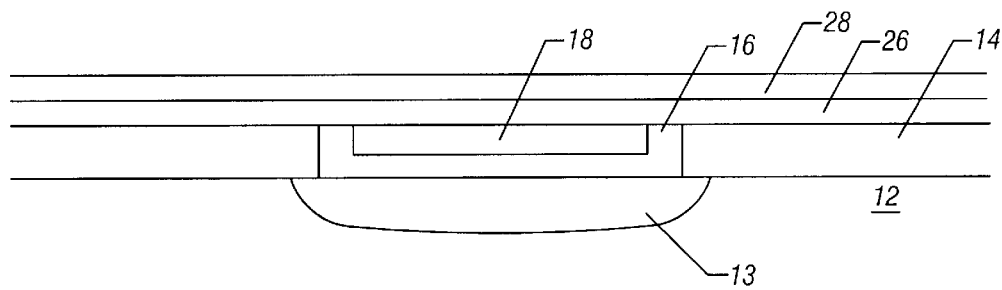
FIG. 6 is an enlarged cross-sectional view of the structure shown in FIG. 5 after further processing.
Figure 7:
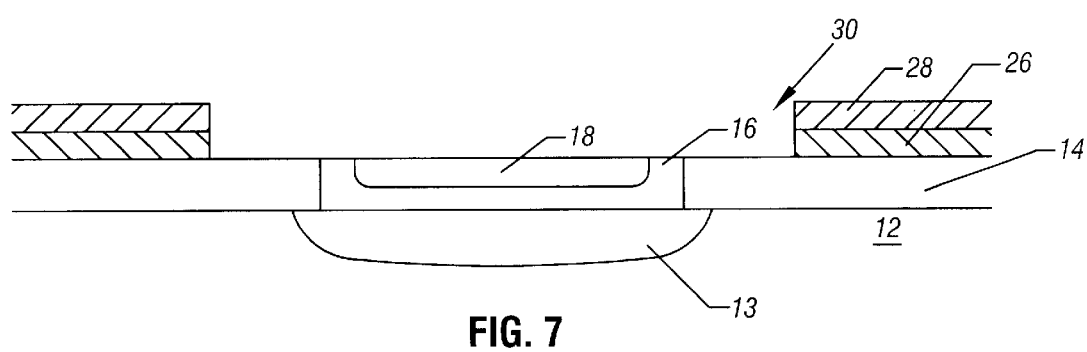
FIG. 7 is an enlarged cross-sectional view of the structure shown in FIG. 6 after further processing.

As shown in FIG. 6, an insulator layer 26, such as an oxide layer, may be defined over the resulting structure shown in FIG. 5. Thereafter, a glue layer 28 may be formed to improve the adhesion between a phase change material (yet to be formed) and the rest of the structure. In one embodiment, the layer 28 may be polysilicon.

Figure 8:
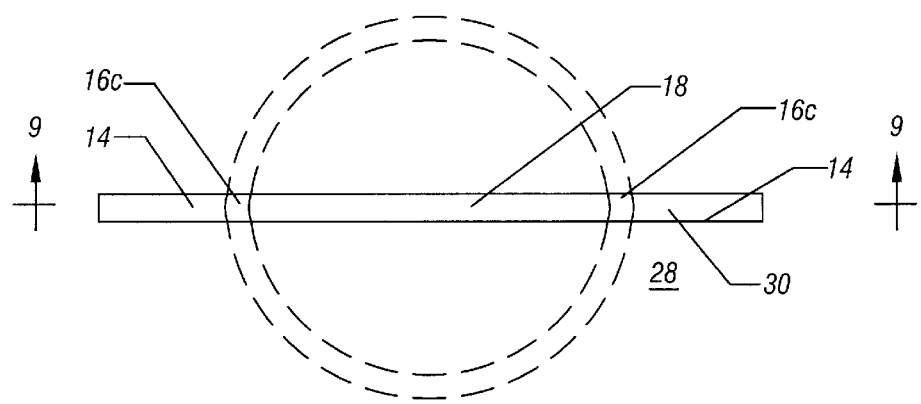
FIG. 8 is an enlarged top plan view of the embodiment shown in FIG. 7.

The structure shown in FIG. 6 may then be exposed through a chrome-less phase shift mask (PSM) or a regular phase shift mask (PSM) to form a narrow, long opening 30 that bisects the electrode 16. Thus, as shown in FIG. 8, a narrow, long opening 30 is formed through the glue layer 28 and insulator 26 bisecting, in this case, the circle defined by the upper edge of the electrode 16.

As a result, only a very small region 16c (which may be square) of the electrode 16 is exposed through the opening 30. One of the exposed regions 16c forms a very small electrical contact to the phase change material as will be explained next.

Figure 9:
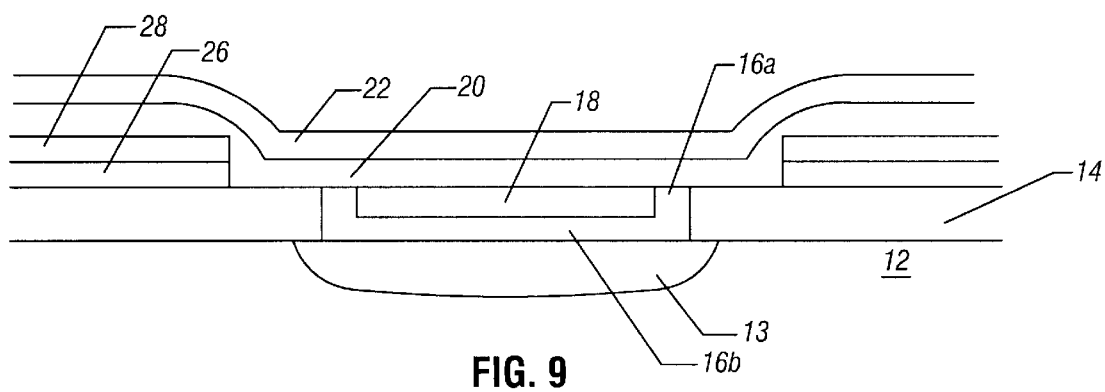
FIG. 9 is an enlarged cross-sectional view taken generally along the line 9—9 in FIG. 8.

Referring to FIG. 9, a phase change material 20, such as a chalcogenide, may be formed over the resulting structure. Next, a conductive material may be formed over the entire structure to eventually form the upper electrode 22. Then, the phase change material 20 and the upper electrode 22 may be masked and etched to form the structure shown in FIGS. 1 and 2.

It may be appreciated that a very small contact 16c may be defined in this way. In fact, the size of the region 16c may be smaller than the minimum feature size available with lithographic techniques. This may greatly increase the resistance of the resulting contact and may improve the performance of the phase change memory in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   an electrode on said substrate, said electrode having a substantially planer surface with a closed geometric shape;
   a layer covering substantially all of the closed geometric shape with the exception of an exposed portion; and
   a phase change material contacting said exposed portion.

2. The memory of claim 1 wherein said closed geometric shape is a circle.

3. The memory of claim 1 wherein said electrode includes a substantially planar bottom portion and at least one upstanding side wall.

4. The memory of claim 3 wherein said side wall is cylindrical.

5. The memory of claim 4 wherein said bottom portion is electrically coupled to a buried conductive layer.

6. The memory of claim 1 wherein said geometric shape is exposed at two separate locations.

7. The memory of claim 1 wherein said closed geometric shape is filled with an insulator.

8. The memory of claim 1 wherein said layer includes an adhesion promoting layer.

9. The memory of claim 9 including an insulator underneath said layer.

10. The memory of claim 9 including an opening through said adhesion promoting layer and said insulator to form said exposed portion.

11. A memory comprising:
    an electrode having a length;
    a layer over said electrode;
    an opening through said layer to expose only a portion of said electrode, said opening extending across the length of said electrode generally transverse to the length of said electrode; and
    a phase change material over said layer and extending through said opening to contact said electrode.

12. The memory of claim 11 wherein said electrode has a closed geometric shape.

13. The memory of claim 12 wherein said closed geometric shape is a circle.

14. The memory of claim 13 wherein said electrode is can-shaped including an upper edge forming a closed geometric shape.

15. The memory of claim 11 wherein said layer includes an adhesion promoting material.

16. The memory of claim 15 wherein said layer includes an insulating material under said adhesion promoting material.

17. The memory of claim 11 wherein said opening exposes two opposed portions of said electrode.

18. The memory of claim 17 wherein said opposed portions of said electrode are portions of a cylinder.

19. A memory comprising:
    an electrode having a length;
    a layer over said electrode;
    an opening through said layer to expose only a portion of said electrode, said opening extending across the length of said electrode, said opening exposing two opposed portions of said electrode; and
    said exposed opposed portions of said electrode are portions of a cylinder.

20. The memory of claim 19 wherein said electrode has a closed geometric shape.

21. The memory of claim 20 wherein said closed geometric shape is a circle.

22. The memory of claim 21 wherein said electrode is can shaped and includes an upper edge forming a closed geometric shape.

* * * * *

UNITED STATES PATENT AND TRADEMARK OFFICE
CERTIFICATE OF CORRECTION

PATENT NO.  : 6,512,241 B1
DATED       : January 28, 2003
INVENTOR(S) : Stefan K. Lai It is certified that error appears in the above-identified patent and that said Letters Patent is hereby corrected as shown below:

Column 3,
Line 54, after "A phase change memory comprising" insert the paragraph:
-- a substrate; --
Line 56, "planer" should be -- planar --.

Column 4,
Line 14, "claim 9" should be -- claim 8 --.

Signed and Sealed this

Nineteenth Day of August, 2003

JAMES E. ROGAN
*Director of the United States Patent and Trademark Office*